United States Patent [19]
Akagiri

[11] Patent Number: 4,851,844
[45] Date of Patent: Jul. 25, 1989

[54] D/A CONVERTER WITH SWITCHED CAPACITOR CONTROL

[75] Inventor: Kenzo Akagiri, Shinagawa, Japan
[73] Assignee: Sony Corporation, Tokyo, Japan

[21] Appl. No.: 26,578
[22] PCT Filed: May 9, 1986
[86] PCT No.: PCT/JP86/00240
§ 371 Date: Jan. 9, 1987
§ 102(e) Date: Jan. 9, 1987
[87] PCT Pub. No.: WO86/06896
PCT Pub. Date: Nov. 20, 1986

[30] Foreign Application Priority Data

May 9, 1985 [JP] Japan .................................. 60-98559

[51] Int. Cl.[4] .............................................. H03K 13/02
[52] U.S. Cl. ...................................... 341/150; 341/144
[58] Field of Search ................. 340/347 DA, 347 CC, 340/347 M, 343 C; 364/844

[56] References Cited

U.S. PATENT DOCUMENTS 3,422,423 1/1969 Kaszynski et al. .......... 340/347 DA

FOREIGN PATENT DOCUMENTS 50-34772 4/1975 Japan .
56-20329 7/1979 Japan .
58-115925 7/1983 Japan .

OTHER PUBLICATIONS

The Engineering Staff of Analog Devices, Inc., Analog-Digital Conversion Handbook, 6/1972, pp. I-61 to I-64.

*Primary Examiner*—Bernard Roskoski
*Attorney, Agent, or Firm*—Hill, Van Santen, Steadman & Simpson

[57] ABSTRACT

There are provided a current-voltage converting means (22) for converting a constant current from a constant current supplying circuit into a voltage, an integration circuit (26), a switched capacitor (23) arranged between the current-voltage converting means (22) and the integration circuit (26) for controlling the charge amount supplied to the integration circuit, and first and second control signal generating circuits (28, 31) respectively having counters (29, 32) and comparators (30, 33) and supplied with first and second digital input signals for controlling switching frequency of the switched capacitor (23) to thereby generate, at an output of the integration circuit (26), an analog signal proportional to a product of the first and second digital input signals, to thereby simplify the circuit configuration and reduce the production cost.

6 Claims, 6 Drawing Sheets

D/A CONVERTER WITH SWITCHED CAPACITOR CONTROL

TECHNICAL FIELD

This invention relates generally to a D/A converter which converts a digital signal into an analog signal (hereinafter be simply referred to as "the D/A conversion"), and more particularly to an integrating type D/A conveter which is preferably adapted to convert a plurality of digital signals into an analog output signal.

BACKGROUND ART

There has been conventionally proposed an example of a D/A conveter which effects the D/A conversion of a product of a plurality of digital input signals, e.g. as shown in FIG. 1. Referring to FIG. 1, reference numeral 1 designates an input terminal to which a digital signal is supplied and this input terminal 1 has n terminals $1_0$, $1_1$, $1_2$, . . . , $1_n$ corresponding to the number of bits of a digital signal to be inputted thereto The digital signal having n bits is parallelly inputted such that the most significant bit (MSB) thereof is supplied to the terminal $1_0$, the bit next to the MSB to the terminal $1_1$, respective bits are supplied sequentially to the respective terminals in the same manner, and finally the least significant bit (LSB) thereof is supplied to the terminal $1_n$.

The n-bit digital signals simultaneously inputted to the terminals $1_0$–$1_n$ are supplied to a data register 2 through input terminal groups 3 and 4 in predetermined conditions. To be specific, the input terminal groups 3 and 4 respectively have m and (m-n-1) input terminals $3_0$-$3_m$ and $4_0$–$4_m$. The terminal $1_0$ is connected only to the terminal $3_0$, and the terminal $1_n$ only to the terminal $4_m$. Further, the terminal $1_1$ is connected to input terminals $3_1$ and $4_0$, the terminal $1_2$ to terminals $3_1$ and $4_1$, and in the same manner, respective terminals of the input terminal group 1 are connected to respective input terminals of the input terminal groups 3 and 4.

Therefore, the input terminal $3_0$ the data register 2 is supplied with the most significant bit of the input digital signal, the input terminal $3_1$ bit next to the most significant bit of the same input digital signal, and in the same manner as above, the respective input terminals $3_2$, $3_3$, . . . , $3_m$ are supplied with the respective bits of the digital input signal. Further, the input terminal $4_0$ of the data register 2 is supplied with the second most significant bit of the input digital signal, the input terminal $4_1$ with the third significant bit of the same, and in the same manner, respective input terminals $4_2$, $4_3$, . . . , $4_m$ are sequentially supplied with the respective bits of the digital input signal. At the last, the input terminal 4*m* is supplied with the least significant bit of the input digital signal supplied to the terminal 1*m*.

The data register 2 switches the digital signals inputted to the input terminal groups 3 and 4 and delivers the same to an output terminal group 5 which has m output terminals $5_0$, $5_1$, . . . , $5_m$. The digital signal outputted to the output terminal group 5, i.e. the signal inputted to the input terminal group 3 or that inputted to the input terminal group 4, is selected by a change-over control signal supplied from a control circuit 7 to the data register 2 through its control terminal 6.

Therefore, delivered to the output terminal group 5 is, in response to the switching operation by the data register 2, either the digital signal from the input terminal group 3, that is, the digital signal comprising from the most significant bit to the second least significant bit or the digital signal from the input terminal group 4, that is, the digital signal comprising from the second most significant bit to the least significant bit.

The manner which of the digital signals supplied to the input terminal groups 3 and 4 is delivered to the output terminal 5 of the data register 2 by switching the same is based upon the result of a determination made as to whether or not the information area of the inputted digital signal exceeds a predetermined information area. Information indicative of the information area of the inputted digital signal can be obtained on the basis of a predetermined number of digits of bit information including the MSB of the inputted digital signal.

The above-mentioned determination operation is effected by the control circuit 7. This control circuit 7 determines whether or not the information area of the inputted digital signal exceeds the predetermined information area on the basis of the predetermined number of digits of bit information including the most significant bit of the inputted digital signal and generates an information area signal (a change-over control signal) according to the determination result.

The signal generated by the control circuit 7 is supplied to the control terminal 6 of the data register 2 and a control terminal 9 of another data register 8, as will be later described. The data registers 2 and 8 carry out the changing operation in response to the information area state in the digital input signals. To be specific, if the digital input signal occupies an information area which is more than one half of the full scale, the data register 2 delivers the digital signal in the input terminal group 3 to the output terminal group 5. On the other hand, if the digital input signal is the signal of the information area less than one half of the full scale, the data register 2 delivers the digital signal in the input terminal group 4 to the output terminal group 5.

The output from the data register 2 is supplied to a latch circuit 10 and this latch circuit 10 latches the digital signal from the data register 2 and supplies the same to a D/A converter 12 at the time a latch signal is applied thereto from a terminal 11.

The D/A converter 12 is a multiplication type one which is provided with an external reference input terminal 13. To this input terminal 13 is supplied an external reference signal generated from another D/A converter 14.

The data register 8 has two input terminal groups 15 and 16 such that two digital signals, generated from a fixed data generating circuit 17, respectively indicative of different data are suppied thereto. To an output terminal group 18 of the data register 8, there is delivered in response to the change-over operation effected by the data register 8, the digital signal indicative of one data from the fixed data generating circuit 17, or the digital signal indicative of the other data from the fixed data generating circuit 17.

The digital signal outputted from the data register 8 is latched by a latch circuit 19 and then supplied to the D/A converter 14 as an input signal, at the time the latch signal is supplied from the terminal 11 to the latch circuit. The D/A converter 14 converts the inputted digital signal into an analog signal and supplies the converted analog signal to the input terminal 13 of the D/A converter 12 as an external reference input signal (external reference voltage).

When the digital signal inputted to the input terminal 1 is the signal of an information area larger than one half of the full scale and the data register 2 delivers the digital signal in the input terminal group 3 to the output terminal group 5, the data register 8 outputs, to the output terminal group 18, the digital signal indicative of the one data supplied from the fixed data generating circuit 17 to the input terminal group 15. On the other hand, when the data register 2 delivers the digital signal in the input terminal group 4 to the output terminal group 5, the data register 8 outputs, to the output terminal group 18, the digital signal indicative of the other data supplied from the fixed data generating circuit 17 to the input terminal group 16. The one data from the fixed data generating circuit 17 is one from which the D/A converter 14 can generate an external reference voltage V which is necessary to deliver to an output terminal 20 an analog signal extended in a predetermined manner from the input digital signal having an information area wider than one half of the full scale. The other data from the fixed data generating circuit 17 is one from which the D/A converter 14 can generate an external reference voltage V/2 which is necessary to deliver to the output terminal 20 an analog signal corresponding to the digital input signal having an information area narrower than one half of the full scale.

By the way, there is disclosed in Japanese Patent laid-open Gazette No. 58-115925 a D/A converter using a switched capacitor.

DISCLOSURE OF THE INVENTION

Accordingly, it is a primary object of the present invention to remove the above defects and provide a D/A converter which is capable of D/A converting a product of a plurality of digital input signals by a single D/A converter.

The D/A converter according to an embodiment of the invention is provided with an integration circuit 26, a current-voltage converting means 22 which converts a constant current from a constant current supplying circuit 21 into a current ratio, a switched capacitor 23 arranged between the current-voltage converting means and the above integration circuit and adapted to control the amount of electrical charge supplied to the integration circuit, control means 28, 31, 39 -46 supplied with first and second digital input signals and for controlling turning on and off of the switched capacitor, and clock generating means 34, 35 for supplying a clock signal to the control means, the construction of which is such that an analog output signal corresponding to a product of the first and second digital input signals is derived from the output side of the integration circuit.

The current-voltage converting means 22 converts the constant current from the constant current supplying circuit 21 to a voltage and supplies the same to the integration circuit 26 through the switched capacitor 23, and at the same time turning on and off of the switched capacitor is controlled by the control means 28, 31, 39-46 which are supplied with the first and second digital input signals, and thereby the analog output signal corresponding to a product of the first and second digital input signals is delivered to the output side of the integration circuit.

BEST MODE FOR CARRYING OUT THE INVENTION

Embodiments of the invention will hereinafter be described in detail with reference to FIGS. 2-7.

First Embodiment

Figure 2:
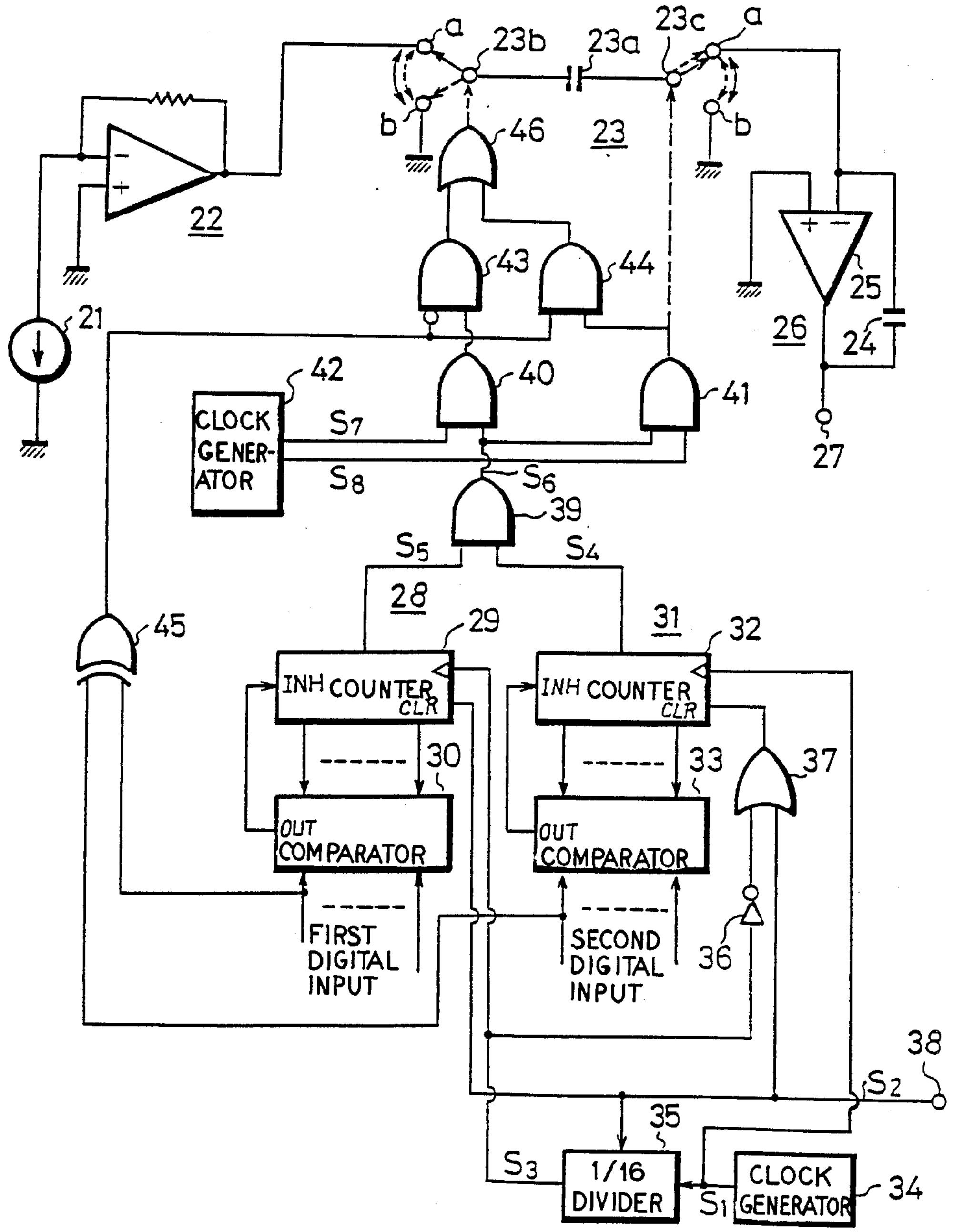
FIG. 2 is a block diagram snowing an embodiment according to the invention.

FIG. 2 shows a circuit configuration of a first embodiment of the present invention. In the same figure, reference numeral 21 designates a constant current supplying circuit as a reference current source. The constant current from the constant current supplying circuit 21 is supplied to a current-voltage converting circuit 22 to be converted into a constant voltage which in turn is supplied to a switched capacitor 23. The switched capacitor 23 comprises a capacitor 23*a* and switches 23*b* and 23*c* respectively arranged at both ends of the capacitor 23*a*. A contact a of the switch 23*b* is connected to an output side of the current-voltage converter 22 while the other contact b thereof is grounded. Further, a contact a of the switch 23*c* is connected to an inverting input terminal of an integration circuit 26 comprising a capacitor 24 and a differential amplifier 25 while the other contact b thereof is grounded.

When the switches 23*b* and 23*c* are changed over as indicated by solid lines in FIG. 2 by a control signal, hereinafter referred to, the switched capacitor 23 operates as a non inverting circuit. On the other hand, if the switches 23*b* and 23*c* are changed over as indicated by broken lines in the same figure, it operates as an inverting circuit. That is, when the switched capacitor 23 operates as a non inverting circuit, if the switch 23*b* is connected to its contact a, the switch 23*c* is also connected to its contact a, and if the switch 23*b* is connected to its contact b, the switch 23*c* is also connected to its contact b. On the other hand, when the switched capacitor operates as an inverting circuit, if the switch 23*b* is connected to its contact a, the switch 23*c* is connected to the contact b, and if the switch 23*b* is connected to its contact b, the switch 23*c* to its contact a.

The constant voltage outputted from the current-voltage converter 22 is supplied through thus operating switched capacitor 23 to the integration circuit 26. From the output side of the integration circuit 26 an output terminal 27, is connected.

Figures 3A, 3B, 3C, 3D, 3E, 3F, 4A, 4B:
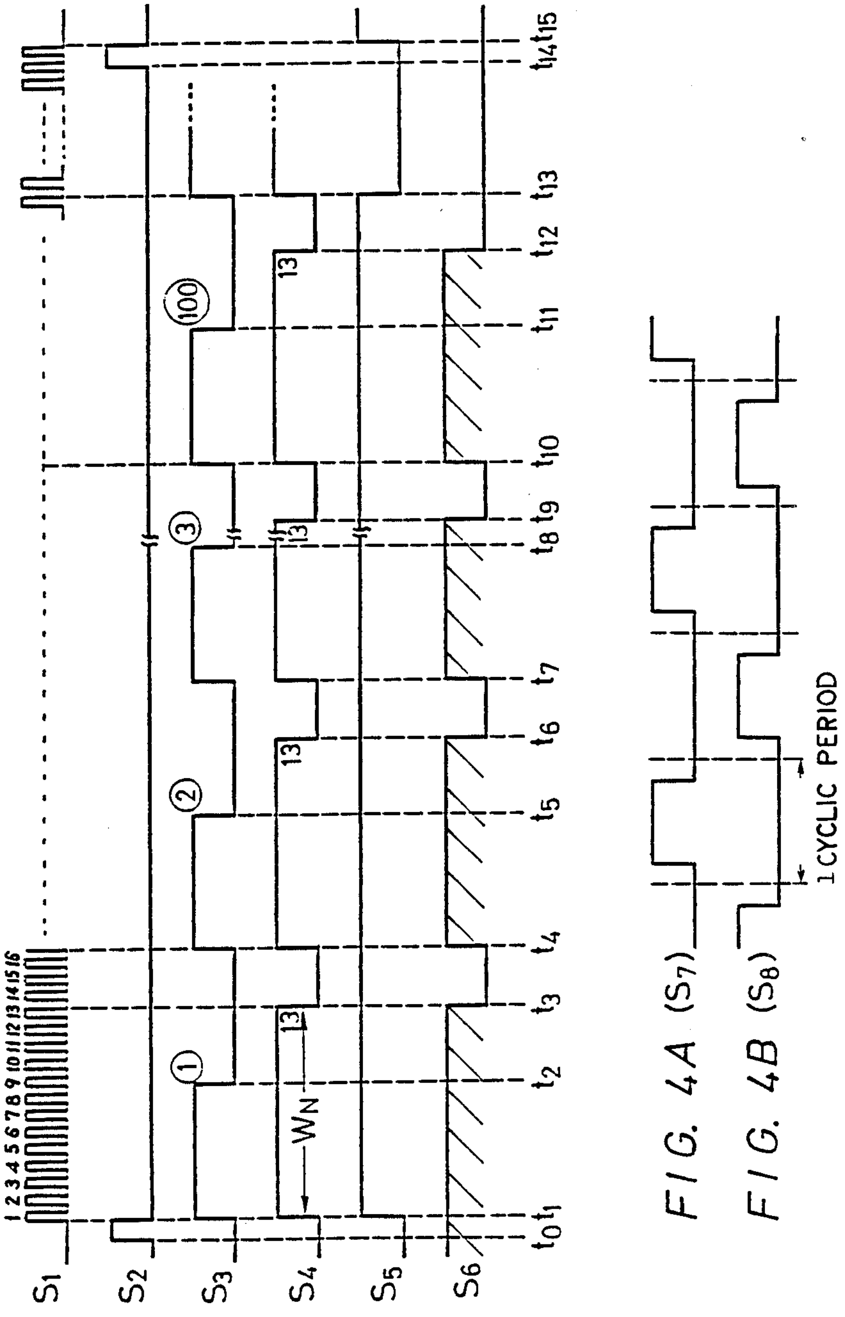
FIGS. 3 and 4 are signal wave form charts used to explain the operation of the embodiment shown in FIG. 2, and FIGS. 5-7 are respectively block diagrams showing other embodiments according to the invention.

Reference numeral 28 is a first control signal generating circuit formed of a counter 29 and a comparator 30 which generates, under the control of a first digital input signal, a pulse signal having a time width proportional to the value of the first input digital signal as a control signal $S_5$ (FIG. 3E). Assuming that if the first digital input signal has 8-bit length, the time width of the control signal (output pulse) generated from the control signal generator circuit 28 corresponds to the value ranging from the minimum value 0 to the maximum value $2^8-1=255$. In FIG. 3, hereinafter referred to, the value of the first input digital signal is determined as $01100100_2=100_{10}$.

Reference numeral 31 is a second control signal generating circuit formed of a counter 32 and a comparator 33 which generates, under the control of a second digital input signal, a pulse signal having a time width proportional to the value of the second input digital signal as a control signal $S_4$ (FIG. 3D). Assuming that if the second digital input signal has 4-bit length, the time width of the control signal (output pulse) generated from the control signal generator circuit 31 corresponds to the value ranging from the minimum value 1 to the maximum value $2^4=16$. In FIG. 2, hereinafter referred to, the value of the first input digital signal is determined as $1101_2=13_{10}$.

Reference numeral 34 designates a clock generator. A clock signal $S_1$ (FIG. 3A) from the clock generator 34 is supplied to a 1/16 frequency divider 35 as well as to a clock terminal of the counter 32 of the control signal generating circuit 31. The clock generator 34 should generate, during one sampling time period, clock pulses whose frequency value is more than or equal to at least a product value (e.g. $16\times225=2^4\times(2^8-1)$) obtained by multiplying a pulse number (e.g. 16) corresponding to the time width of the maximum value of the output pulse generated from the control signal generating circuit 31 by a value (e.g. 225) corresponding to the time width of the maximum value of the output pulse generated from the control signal generating circuit 28.

The 1/16 frequency divider 35 is made to include $2^4=16$ clock pulses during one cyclic period of the output thereof. An output signal $S_3$ (FIG. 3C) from the 1/16 frequency divider 35 is supplied to a clock terminal of the counter 29 as well as to a clear terminal of the counter 32 through an inverter 36 and an OR circuit 37. The counter 32 is reset at an edge, e.g. at a rising edge of the output signal.

Reference numeral 38 is an input terminal to which is supplied a start signal $S_2$ (FIG. 3B) to turn the whole converter on. The start signal from the input terminal 38 is supplied to the 1/16 frequency divider 35 as a reset signal, a clear terminal of the counter 29, and the clear terminal of the counter 32 through the OR circuit 37.

The control signals $S_5$ and $S_4$ generated from the control signal generating circuits 28 and 31 are both supplied to an AND circuit 39 and an output signal $S_6$ (FIG. 3F) of the AND circuit 39 is supplied to one input terminal of respective AND circuits 40 and 41. Reference numeral 42 designates a clock generator which generates clock signals to change over the switches **23*b* and 23*c* of the switched capacitor 23. Generated from the clock generator 42 are two clock signals $S_7$ and $S_8$ having opposite phase one another as shown in FIG. 4. The signals $S_7$ and $S_8$ are respectively supplied to the other input terminals of the AND circuits 40 and 41. The AND circuits 40 and 41 operate so as to substantially mask the clock signals $S_7$ and $S_8$ from the clock generating circuit 42 by the use of the output signal $S_6$ from the AND circuit 39, whereby the switched capacitor 23** operates only when the control signals $S_5$ and $S_4$ are both outputted simultaneously.

The output signal from the AND circuit 41 is directly used as a control signal for the switch **23*c* of the switched capacitor 23. The output signals from the AND circuits 40 and 41 are respectively supplied to one input terminal of AND circuits 43 and 44. Further, a bit (MSB) indicative of the polarity of the first digital input signal supplied to the comparator 30 and a bit (MSB) indicative of the polarity of the second digital input signal supplied to the comparator 33 are supplied to an exclusive OR circuit 45, the output signal of which is supplied to the other input terminal of the respective AND circuits 43 and 44**.

Incidentally, the output signal of the exclusive OR circuit 45 becomes low level when the first and second digital input signals have the same polarity, and high level when these signals have respectively the different polarities from each other. The AND circuits 43 and 44 substantially determine, by the bits indicative of the polarity of the first and second input digital signals, which of the clock signals $S_7$ and $S_8$ derived from the clock generating circuit 42 is supplied to the switch **23*b* of the switched capacitor 23, to thereby change over the operation of the switched capacitor 23 from non inverting to inverting. To be specific, when the switch 23*c* of the switched capacitor 23 is supplied with the clock signal $S_8$ from the clock generator 42 through the AND circuit 41 if the switch 23*b* is supplied with the clock signal $S_8$ from the clock generator circuit 42 through the AND circuit 44 and the OR circuit 46, the switched capacitor 23 operates as a non-inverting circuit, since there is the in-phase relationship between the signals supplied thereto. On the other hand, if the switch 23*b* is supplied with the signal $S_7$ from the clock generating circuit 42 through the AND circuit 43 and the OR circuit 46, the switched capacitor 23** operates as an inverting circuit, since there is the anti-phase relationship between the signals supplied thereto.

Next, the operation of the circuit shown in FIG. 2 will be explained with reference to FIGS. 3 and 4.

The start signal $S_2$ as shown in FIG. 3B is supplied at a time $t_0$ from the input terminal 38 to the 1/16 frequency divider 35, the clear terminal of the counter 29, and the counter 32 through the OR circuit 37. Then, at a time $t_1$ when the signal $S_2$ is fallen down, the 1/16 frequency divider 35 and counters 29 and 32 are reset. As a result, at the same time the output signal $S_3$ from the 1/16 frequency divider 35 becomes high level as shown in FIG. 3C, the output signals (control signals) $S_4$ and $S_5$ from the control signal generating circuits 31 and 28 become high level, as shown respectively in FIGS. 3D and 3E.

When the output signals $S_4$ and $S_5$ from the control signal generating circuits 31 and 28 become high level, the output signal $S_6$ from the AND circuit 39 also becomes high level, as shown in FIG. 3F. When the signal $S_6$ is supplied to the AND circuits 40 and 41 to open their gates, the clock signals $S_7$ and $S_8$ from the clock generator 42, as shown in FIGS. 4A and 4B, pass therethrough. The clock signal $S_8$ through the AND circuit 41 is supplied to the switch **23*c* of the switched capacitor 23 as a control signal as it is and also to the AND circuit 44. The clock signal $S_7$ through the AND circuit 40 is supplied to the AND circuit 43. It is determined, by the control of the output signal from the exclusive OR circuit 45, which of the clock signal $S_8$ through the AND circuit 44 and the clock signal $S_7$ through the AND circuit 43 is supplied through the OR circuit 46 to the switch 23*b* of the switched capacitor 23 as a control signal. To be specific, when the output signal from the exclusive OR circuit 46 is at high level, that is, when the first and second digital input signals respectively supplied to the comparators 30 and 33 have the same polarity, the AND circuit 43 closes its gate while the AND circuit 44 opens its gate, and consequently the clock signal $S_8$ through the AND circuit 44 is supplied through the OR circuit 46 to the switch 23*b* of the switched capacitor 23 as a control signal, whereby at that time the switched capacitor 23 operates as a non inverting circuit. On the other hand, when the output signal from the exclusive OR circuit 46 is at low level, that is, when the first and second digital input signals respectively to the comparators 30 and 33 have different polarities from each other, the AND circuit 44 closes its gate while the AND circuit 43 opens its gate, and consequently the clock signal $S_7$ through the AND circuit 43 is supplied through the OR circuit 46 to the switch 23b of the switched capacitor 23 as a control signal, whereby at that time the switched capacitor 23** operates as an inverting circuit.

When the constant voltage derived from the current-voltage converter 22 is accumulated in the capacitor 23a of the switched capacitor 23 operating as mentioned above, the constant voltage is supplied to the integration circuit 26 to thereby start charging the capacitor 24.

The counters 29 and 31 begin their operation at the time $t_1$, the counter 29 is in a state to count the pulses on the signal $S_3$ supplied thereto from the 1/16 frequency divider 35, while the counter 31 starts sequentially counting the pulses of the clock signal $S_1$, as shown in FIG. 3A, generated from the clock generator 34. Then, at the time $t_2$ the output signal from the 1/16 frequency divider 35 is inverted from high level to low level.

As the value of the second digital input signal supplied to one input side of the comparator 33 is assumed to be $1101_2=13_{10}$, as mentioned above, at a time $t_3$, the contents of the counter 31 supplied to the other input side of the comparator 33 become equal to that of the second digital input signal supplied to one input side thereof, so that the comparator 33 generates an output signal which is supplied to an inhibit terminal INH of the counter 32, whereby the contents of the counter 32 is reset to be 0. Consequently, the output signal $S_4$ from the control signal generating circuit 31 also becomes low level as shown in FIG. 3D. During this low level period, the output signal $S_6$ from the AND circuit 39 is also at low level as shown in FIG. 3F, so that the AND gates 40 and 41 do not open their gates. Accordingly, the clock signals $S_7$ and $S_8$ from the clock generator 42 are not supplied to the switched capacitor 23, and therefore the integration circuit 26 is substantially inhibited from being supplied with the constant voltage derived from the constant current supplying circuit 21 through the current-voltage converting circuit 22 and the switched capacitor 23.

At a time $t_4$, the counter 29 starts counting pulses of the signal $S_3$ outputted from the 1/16 frequency divider 35, and the counter 32 is reset by the signal $S_3$ from the 1/16 frequency divier 35 and again starts counting pulses of the clock signal derived from the clock signal generator 34. Also at the time $t_4$, the signal $S_3$ from the 1/16 frequency divider 35 is inverted from low level to high level.

At a time $t_5$, the signal $S_3$ from the 1/16 frequency divider 35 is again inverted from high level to low level. Next, at a time $t_6$, the same operations as those effected at the time $t_3$ are effected. Then, during a time period between a time $t_7$ and a time $t_{12}$, the above-mentioned operations are repeated.

At a time $t_{13}$, whereat the counted value of pulses of the signal $S_3$ from the 1/16 frequency divider 35 by the counter 29 exceeds the value of the first digital input signal, i.e. $100_{10}=1100100_2$, which is supplied to the one input side of the comparator 30, the comparator 30 outputs to its output terminal a signal which is supplied to an inhibit terminal INH of the counter 29 to thereby reset the content of the counter 29 to zero. Consequently, the output signal $S_5$ from the control signal generating circuit 28 also becomes low level as shown in FIG. 3E, whereby the output signal $S_6$ from the AND circuit 39 also becomes low level, as shown in FIG. 3F, rendering the switched capacitor 23 inoperative, so that the integration circuit 26 is substantially inhibited from being supplied with the constant voltage.

At a time $t_{14}$, the start signal $S_2$ is again supplied from the input terminal 38 to the 1/16 frequency divider 35 as a reset signal as well as to the clear terminals of the respective counters 29 and 32. Then, the above-mentioned operations during the time period between the times $t_1$ and $t_3$ are repeated in the same manner. Incidentally, the digital input signals supplied to the comparators 30 and 33 may have values different from those as determined above.

Figure 5:
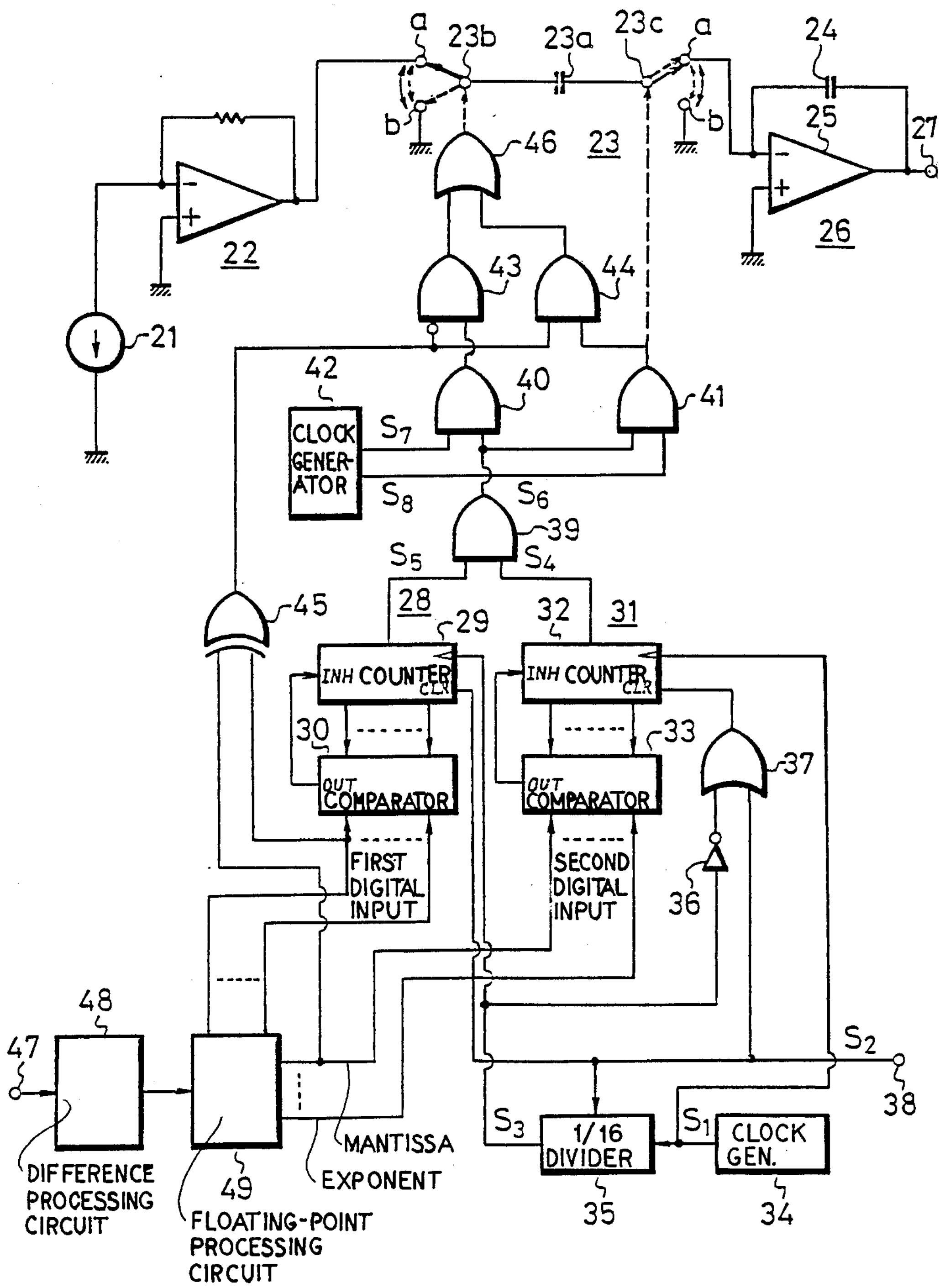

As described above, according to the present embodiment, assuming that on-periods of the switches 23b and 23c are respectively taken as $N_1$ and $N_2$ and an equation $|N|-|N_1 \times N_2|$ is established, an analog output converted from a product of two digital input signal values can be generated by setting $N_1$ and $N_2$ to values corresponding to the two digital input signal values. Second Embodiment FIG. 5 shows a circuit configuration of a second embodiment of the invention. In the same figure, the same reference numerals designate the same parts in FIG. 2 and the detailed description thereof is omitted.

Figure 1:
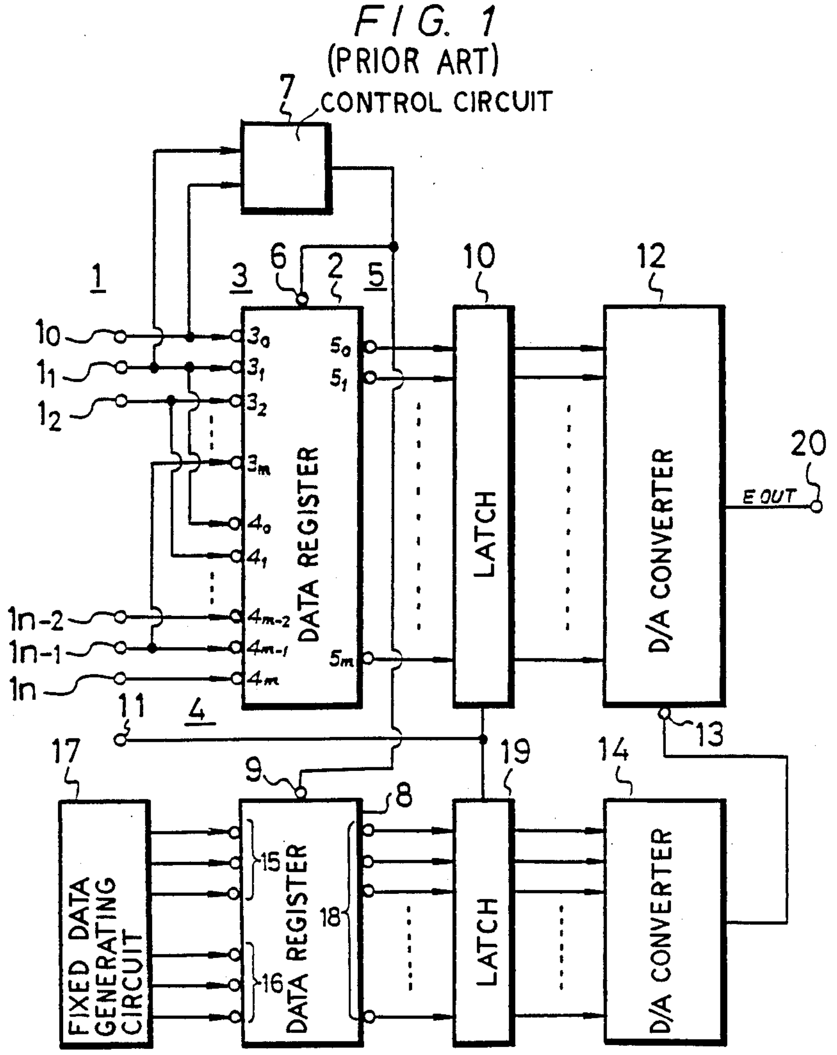
FIG. 1 (PRIOR ART)
FIG. 1 is a block diagram used to explain a prior art example.

In the present embodiment, a digital signal supplied to an input terminal 47 is supplied to a difference processing circuit 48 wherein the difference between adjacent sampled values is obtained. Then, the output signal from the difference processing circuit 48 is supplied to a floating-point processing circuit 49 wherein the supplied signal is divided into signals indicative of a mantissa portion and an exponent portion. The mantissa portion is supplied to the comparator 30 as the first digital input signal, and the exponent portion to the comparator 33 as the second input digital signal. The other configuration thereof is the same as that of FIG. 1.

The integration circuit 26 can obtain a desired analog signal at the output terminal 27 by sequentially integrating each sampled value without resetting the same.

Figure 6:
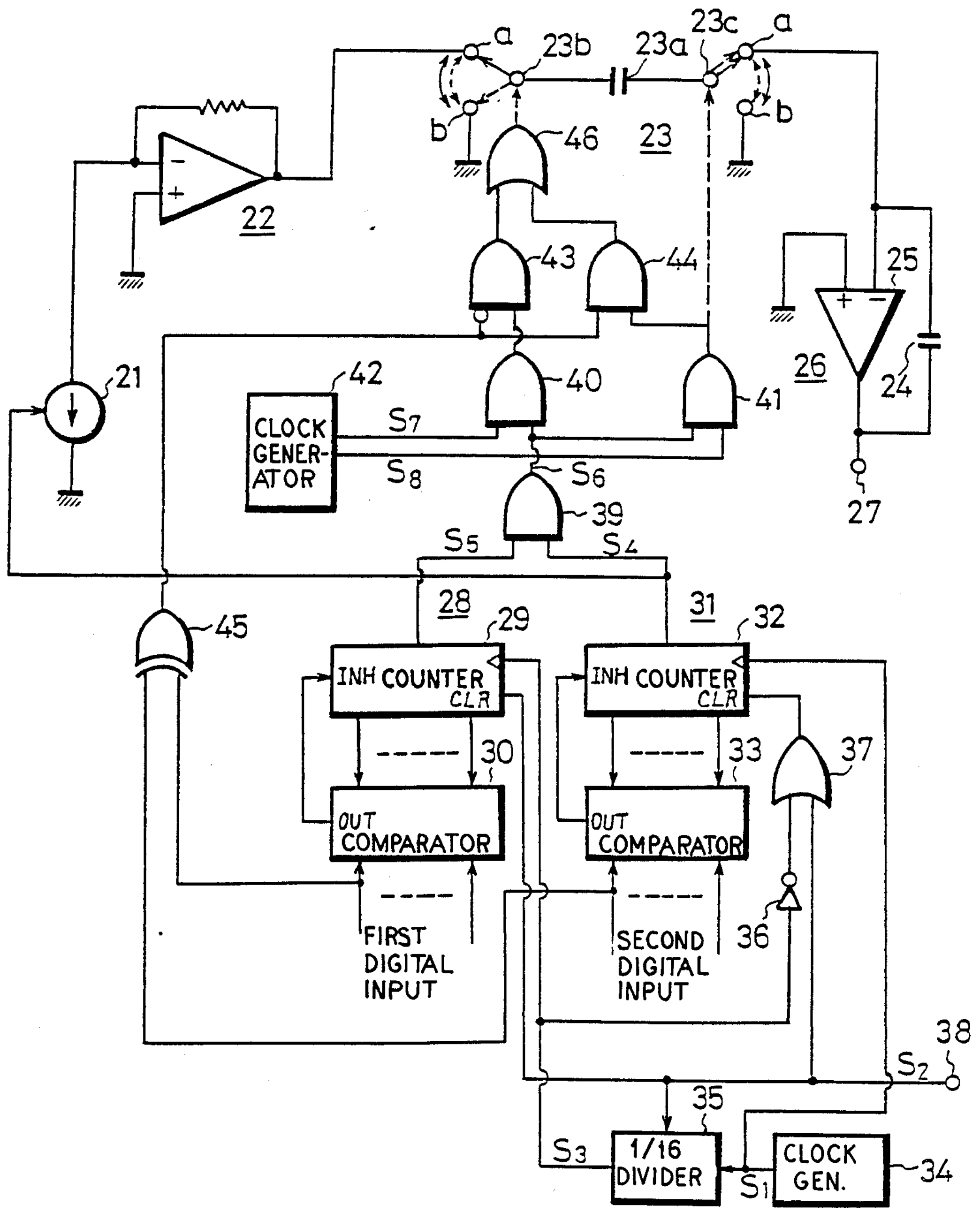

The S/N ratio for a medium-low region of the analog signal delivered to the output terminal 27 by this embodiment can be made larger than that of the first digital input signal supplied to the comparator 30. Third Embodiment FIG. 6 shows a circuit configuration of a third embodiment of this invention. In this figure, the same reference numerals designate the same parts in FIG. 2 and the detailed description thereof is omitted.

In the present embodiment, the constant current supplying circuit 21 is controlled by the control signal generating circuit 31, and the value of the second input digital signal supplied to the comparator 33 of the control signal generating circuit 31, the pulse width $W_N$ (refer to FIG. 3D) of the control signal $S_4$ derived from the control signal generating circuit 31 and the value of a current I outputted from the constant current supplying circuit 21 have a relationship as shown in the following table:

| Value of Second Input Digital Signal | Pulse Width $W_N$ of Control Signal $S_4$ | Current Value I from Constant Circuit 21 |
|---|---|---|
| 1 | 1 | 1 |
| 2 | 2 | 1 |
| 4 | 4 | 1 |
| 8 | 1 | 8 |
| 16 | 2 | 8 |
| 32 | 4 | 8 |

Figure 7:
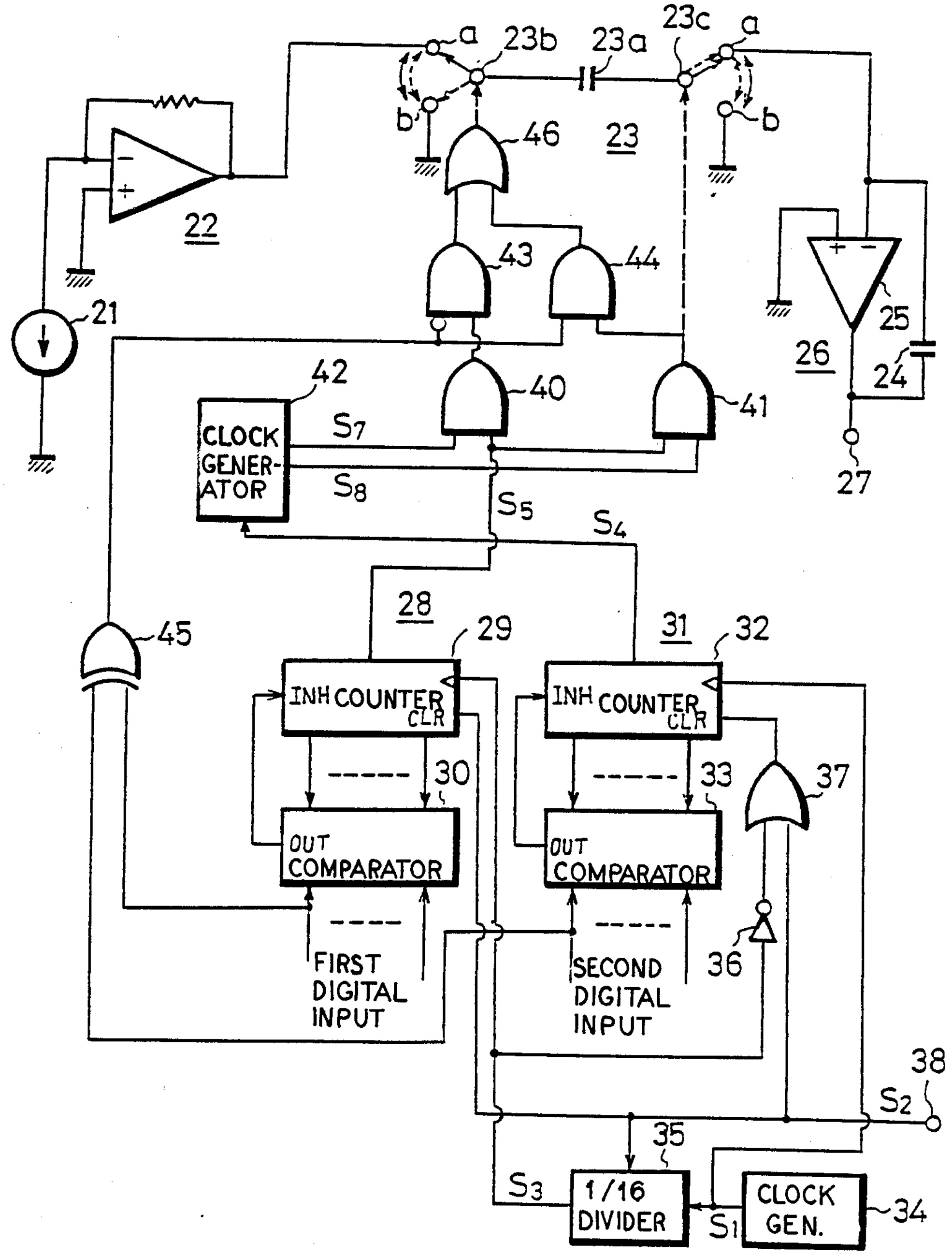

By the above setting, the maximum value of the pulse width $W_N$ of the control signal $S_4$ generated from the control signal generating circuit 31 can be made small and hence, the sampling frequency can be increased, and due to the decrease of an IC clock number the IC production becomes easy. Fourth Embodiment FIG. 7 shows a circuit configuration of a fourth embodiment of the invention. In this figure, the same reference numerals designate the same parts in FIG. 2 and the detailed description thereof is omitted.

In the present embodiment, the clock generator 42 generating the clock signals $S_7$ and $S_8$ is controlled by the control signal $S_4$ derived from the control signal generating circuit 31, and the value of the second digital input signal supplied to the comparator 33 is set in correspondence to the frequency of the clock signals $S_7$ and $S_8$ from the clock generator 42, whereby it is possible to generate a number of the pulse signals proportional to the value of the second input digital signal. In this case, the control signal $S_4$ is supplied to the clock generator 42 and the control signal $S_5$ to the AND circuits 40 and 41. Therefore, the AND circuit 39 is not necessary, to thereby simplify the circuit configuration of the present embodiment.

Other Embodiments

In the above explained respective embodiments, the absolute value of at least one of the first and second input digital signals may be determined as $2^n$ (n=0, 1, 2, . . . ), which is used for a floating-point calculation.

Further, in each of the above respective embodiments, a plurality of circuit configurations constructed by all the circuit components other than the integration circuit 26 may be connected to the integration circuit 26, wherein if it is assumed that there are N circuits connected to the integration circuit, $$Vout = \sum_{n-1}^{N} (DI_{1n} \times DI_{2n}) \quad (1)$$

is obtained. In the above equation (1), Vout is an analog output signal, $DI_{1n}$ represents the first digital input signal supplied to the nth multiplication circuit (corresponding to the circuit constructed by all the circuit components other than the integration circuit 26), and $DI_{2n}$ the second input digital signal supplied to the nth multiplication circuit. By the configuration described above, it is possible to obtain an analog signal representative of added value far larger than the maximum value of each of the input digital signals without occurring saturation, which particularly is useful for an output portion of an electronic musical instrument.

In relation to the above-mentioned configuration, a plurality of the control signal generating circuits 28 may be provided. Assuming that there are provided N control signal generating circuits, $$Vout = \sum_{n-1}^{N} DI_n \quad (2)$$

is obtained In the above equation (2), $DI_n$ represents the first digital input signal supplied to the nth control signal generating circuit 28.

Further, it may be possible that each of the aforementioned embodiments may be provided with two constant current supplying circuits of a different value as the constant current circuit 21 to form a continually integrating D/A converter, wherein upper bits of the first digital input signal are converted by the use of the current supplying circuit having a larger current value or both of the current supplying circuits, and lower bits of the first digital input signal is converted by the use of the current supplying circuit having a smaller current value. This embodiment has an advantage of lowering the clock frequency.

As described above, according to the present invention, the switched capacitor arranged between the integration circuit and the constant current supplying circuit is controlled in response to the values of the first and second digital input signals, so that an analog output corresponding to a product of a plurality of input digital signals can be generated by only one D/A converter, whereby the configuration of the circuit is simplified and the producion cost is reduced.

What is claimed is:

1. A D/A converter comprising first digital signal inputting means, a second digital signal inputting means, a constant voltage generating circuit, an integration circuit, a switched capacitor circuit arranged between said constant voltage generating circuit and said integration circuit, said switched capacitor circuit connected to receive an input signal from said constant voltage generating circuit and to provide a pulsed output signal to said integration circuit with said pulsed output signal having a controllable duty cycle, a first control circuit for controlling the duty cycle of said switched capacitor circuit by said first digital input signal, and a second control circuit for controlling the repetition of the duty cycle of said switched capacitor circuit by said second digital input signal, which generates, at an output of said integration circuit, an analog signal proportional to a product of said first and second digital input signals, and clock generator means for supplying clock signals to said first control circuit at a pulse repetition rate of f and for supplying clock signals to said second control circuit at a pulse repetition rate of f/n, where n is a function of the period of operation of said switched capacitor circuit, as controlled by said first control circuit.

2. A D/A converter according to claim 1, in which said first control circuit comprises a first counter which is supplied with a clock pulse, a first comparator which compares the counted value of said counter with said first digital input signal, and a first gate circuit which controls the duty cycle of said switched capacitor circuit by an output signal from said comparator.

3. A D/A converter according to claim 1, in which said second control circuit comprises a second counter which is supplied with a frequency-divided output of said clock pulse as its clock pulse, a second comparator which compares the counted value of said counter with said second digital input signal, and a second gate circuit which controls the repetition of the duty cycle of said switched capacitor circuit by an output signal from said second comparator.

4. A D/A converter according to claim 3, in which said first digital input signal represents a mantissa portion outputted from a floating-point processing circuit.

5. A D/A converter according to claim 4, in which said second digital input signal represents an exponent portion outputted from said floating-point processing circuit.

6. (After being amended) A D/A converter according to claim 1, in which said constant voltage generating circuit is formed of a current-voltage converting means which converts a constant current generated from a constant current supplying circuit into a constant voltage, and the current value of said constant current supplying circuit is varied in response to a digital value of said first digital input signal.

* * * * *